United States Patent
Kuo et al.

(10) Patent No.: US 6,633,949 B2
(45) Date of Patent: Oct. 14, 2003

(54) BANK SELECTOR CIRCUIT FOR A SIMULTANEOUS OPERATION FLASH MEMORY DEVICE WITH A FLEXIBLE BANK PARTITION ARCHITECTURE

(75) Inventors: Tiao-Hua Kuo, San Jose, CA (US); Yasushi Kasa, Cupertino, CA (US); Nancy Leong, Sunnyvale, CA (US); Johnny Chen, Cupertino, CA (US); Michael Van Buskirk, Saratoga, CA (US)

(73) Assignees: Advanced Micro Devices, Inc., Sunnyvale, CA (US); Fujitsu Limited, Kanagawa (JP)

( * ) Notice: Subject to any disclaimer, the term of this patent is extended or adjusted under 35 U.S.C. 154(b) by 0 days.

(21) Appl. No.: 09/892,431

(22) Filed: Jun. 26, 2001

(65) Prior Publication Data

US 2002/0010828 A1 Jan. 24, 2002

Related U.S. Application Data

(62) Division of application No. 09/159,489, filed on Sep. 23, 1998, now Pat. No. 6,275,894.

(51) Int. Cl.[7] .............................................. G06F 12/00
(52) U.S. Cl. .................. 711/102; 711/173; 365/230.03; 365/230.06
(58) Field of Search .................. 711/103, 173, 711/102; 365/230.03, 230.06

(56) References Cited

U.S. PATENT DOCUMENTS

| | | | |
|---|---|---|---|
| 4,459,660 A | 7/1984 | Bellay et al. ................... | 711/1 |
| 4,905,141 A | 2/1990 | Brenza ........................ | 711/129 |
| 5,175,840 A * | 12/1992 | Sawase et al. ......... | 365/185.04 |
| 5,245,572 A | 9/1993 | Kosonocky et al. ... | 365/189.02 |
| 5,265,053 A | 11/1993 | Naradone et al. ........... | 365/193 |
| 5,691,945 A | 11/1997 | Liou et al. ................... | 365/200 |
| 5,761,700 A | 6/1998 | Cozart et al. ............... | 711/102 |
| 5,841,696 A | 11/1998 | Chen et al. ............ | 365/185.11 |
| 5,847,998 A | 12/1998 | Van Buskirk .......... | 365/185.33 |
| 5,867,430 A | 2/1999 | Chen et al. ............ | 365/189.04 |
| 5,890,192 A * | 3/1999 | Lee et al. ................... | 365/120 |
| 6,026,021 A | 2/2000 | Hoang ................... | 365/185.11 |
| 6,230,233 B1 * | 5/2001 | Lofgren et al. .......... | 365/185.3 |

FOREIGN PATENT DOCUMENTS

EP    0 741 387 A3    12/1996

* cited by examiner

*Primary Examiner*—Donald Sparks
*Assistant Examiner*—Brian R. Peugh
(74) *Attorney, Agent, or Firm*—Fliesler Dubb Meyer & Lovejoy, LLP

(57) ABSTRACT

A bank selector encoder comprises a partition indicator circuit having a plurality of partition boundary indicator terminals, a plurality of inverters arranged in a plurality of columns, with each column of the inverters coupled to a respective one of a plurality of columns of ROM cells in a ROM array and a plurality of bank selector code outputs coupled to respective columns of the inverters. The partition boundary indicator terminals are capable of designating a memory partition boundary to identify an upper memory bank and a lower memory bank. The bank selector encoder is capable of generating an identifying bank selector code for each of a plurality of the predetermined memory partition boundaries. The bank selector encoder outputs code bits of a bank selector code based upon the partition boundary indicator terminals.

5 Claims, 7 Drawing Sheets

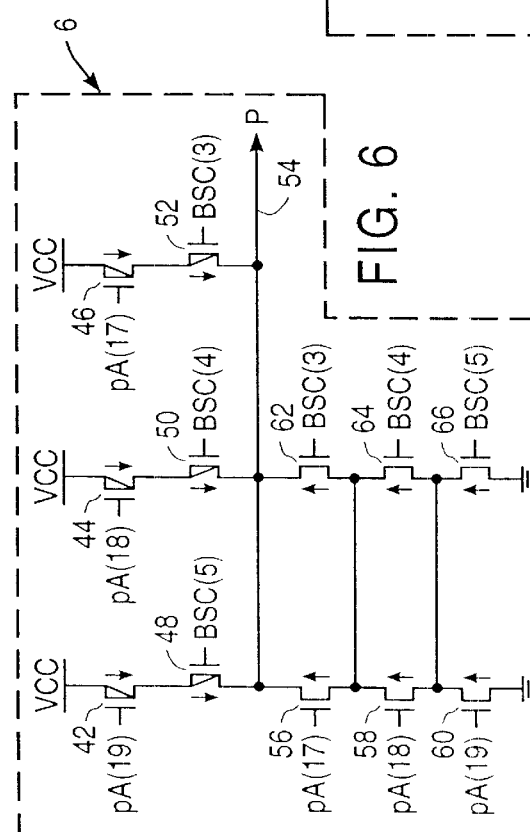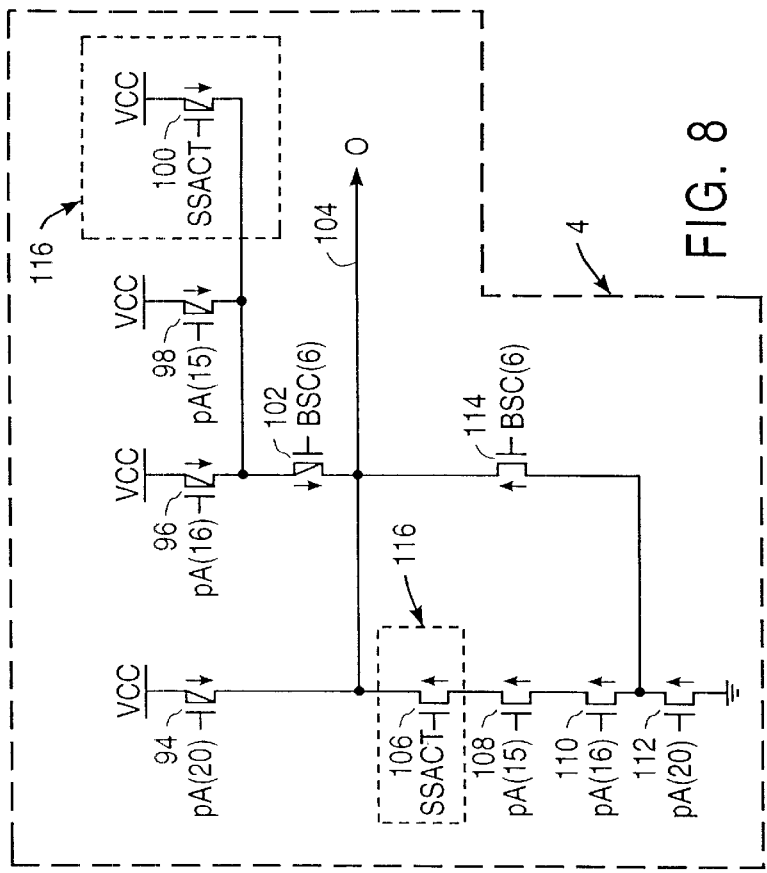

BANK SELECTOR CIRCUIT FOR A SIMULTANEOUS OPERATION FLASH MEMORY DEVICE WITH A FLEXIBLE BANK PARTITION ARCHITECTURE

CROSS-REFERENCE TO RELATED APPLICATIONS

This application is a divisional of Serial No. 09/159,489, filed Sept. 23, 1998 now U.S. Pat. No. 6,275,894.

FIELD OF INVENTION

The present invention relates to a flash memory device, and more particularly, to a simultaneous operation flash memory device with a flexible bank partition architecture.

BACKGROUND OF THE INVENTION

Non-volatile flash memory devices have been developed by the semiconductor integrated circuit industry for various applications such as computers and digital communications. A conventional non-simultaneous operation flash memory device typically includes a single fixed memory bank. A conventional simultaneous operation flash memory device typically comprises two fixed memory banks each comprising a fixed number of sectors of memory cells. Each sector of memory cells has a fixed amount of memory storage, for example, 0.5 megabytes (MB), and consists of a fixed number of pages of memory cells, for example, 16 pages of memory cells. A page is typically defined as one word of memory stored in the memory cells on a single word line.

In a conventional simultaneous operation flash memory device, for example, a conventional simultaneous operation NOR flash memory array, the NOR memory cells are divided into an upper memory bank and a lower memory bank each having a fixed size of memory storage. The upper and lower memory banks are typically used for different functions. For example, the upper memory bank may be used for code storage, whereas the lower memory bank may be used for data storage. Because the upper and lower bank memory partitions are fixed in conventional simultaneous operation flash memory devices, different simultaneous operation flash memory devices with different integrated circuit designs are required for different memory partitions. Therefore, in order to suit a variety of applications which may require different partitions of the upper and lower memory banks for code and data storage, new circuit designs would be required for different applications.

Because the size of memory storage in each of the upper and lower banks is not variable in a conventional simultaneous operation flash memory device, a single circuit design for a conventional simultaneous operation flash memory device may be suitable for only one of several different applications in which different partitions of the upper and lower memory banks are required. In order to produce simultaneous operation flash memory devices with different partitions of the upper and lower memory banks, a different circuit design and a full set of different masks are required for each of the devices. A disadvantage of having to design a different integrated circuit and a full set of different masks for each of the simultaneous operation flash memory devices with different upper and lower bank memory partitions is that the design, fabrication and testing processes can be very costly and time consuming. Therefore, there is a need for a simultaneous operation flash memory device with a flexible bank partition architecture. Furthermore, there is a need for a bank selector circuit for selecting the upper and lower memory banks in a simultaneous operation flash memory device with a flexible bank partition architecture in response to a memory address input.

SUMMARY OF THE INVENTION

The present invention satisfies these needs. In accordance with the present invention, a bank selector circuit for a simultaneous operation memory device with a flexible bank partition architecture generally comprises:

(a) a memory boundary option designating a memory partition boundary selected from a plurality of predetermined memory partition boundaries, the memory boundary option capable of generating a partition boundary indicator signal based upon the selected memory partition boundary;

(b) a bank selector encoder, coupled to the memory boundary option, capable of generating a plurality of code bits of a bank selector code based upon a partition of memory into an upper memory bank and a lower memory bank at the memory partition boundary in response to receiving the partition boundary indicator signal; and (c) a bank selector decoder coupled to receive the bank selector code from the bank selector encoder and further coupled to receive a plurality of memory address bits of a memory address, the decoder having a bank selector output capable of signifying whether the memory address belongs to the upper memory bank or the lower memory bank.

In an embodiment, the memory boundary option comprises a plurality of memory partition boundary indicator terminals capable of outputting a partition boundary indicator signal. In a further embodiment, the bank selector encoder comprises a read-only memory (ROM) array coupled to the partition boundary indicator terminals of the memory boundary option and capable of outputting a bank selector code in response to receiving the partition boundary indicator signal from the respective partition boundary indicator terminals. A unique bank selector code is generated by the bank selector encoder for each of the predetermined memory partition boundaries which can be designated by the memory boundary option.

In yet a further embodiment, the decoder comprises a logic bit P determining circuit coupled to receive a first plurality of the bank selector code bits and a first plurality of the memory address bits, a logic bit Q determining circuit coupled to receive a second plurality of the code bits and the first plurality of the memory address bits, and a logic bit O determining circuit coupled to receive a third one of the bank selector code bits and a second plurality of the memory address bits. The bank selector decoder further comprises an output logic circuit coupled to the logic bit O, P and Q determining circuits to generate a single-bit bank selector output signal to signify whether the memory address belongs to the upper memory bank or the lower memory bank.

In an embodiment, the output logic circuit comprises an AND gate and a NOR gate. The AND gate has first and second AND gate inputs and an AND gate output, the first and second AND gate inputs connected to the logic bit P and Q determining circuits, respectively. The NOR gate has first and second NOR gate inputs and a NOR gate output, the first and second NOR gate inputs connected to the logic bit O determining circuit and to the AND gate output, respectively. The NOR gate output generates the bank selector output signal.

In a further embodiment, the partition indicator circuit further comprises upper and lower bank conductive line segments coupled to the respective inputs of a plurality of NOR gates, the outputs of which form the respective partition boundary indicator terminals. In an additional embodiment, the logic bit O, P and Q determining circuits each comprise a plurality of p-channel metal oxide semiconductor (PMOS) and n-channel MOS (NMOS) transistors coupled to receive at least some of the memory address inputs and the bank selector code bits, with the outputs of the logic bit O, P and Q determining circuits coupled to the output logic circuit.

Advantageously, the present invention provides a bank selector circuit for selecting the upper or lower memory bank in a simultaneous operation flash memory device with a flexible bank partition architecture based upon the memory partition boundary in response to receiving a memory address. The present invention allows a simultaneous operation flash memory device with a flexible bank partition architecture to be realized without the costs and efforts associated with designing different circuits and preparing different sets of masks for meeting the requirements of different memory bank sizes to produce different conventional simultaneous operation flash memory devices with fixed upper and lower bank partitions.

BRIEF DESCRIPTION OF THE DRAWINGS

The present invention will be described with respect to particular embodiments thereof, and references will be made to the drawings in which:

FIG. 6 is a circuit diagram showing an embodiment of a logic bit P determining circuit in the bank selector circuit according to the present invention;

FIG. 7 is a circuit diagram showing an embodiment of a logic bit Q determining circuit in the bank selector circuit according to the present invention;

FIG. 8 is a circuit diagram showing an embodiment of a logic bit O determining circuit in the bank selector circuit according to the present invention;

DETAILED DESCRIPTION

Figure 1:
FIG. 1 is a diagram illustrating a flash memory device comprising a plurality of blocks of memory cells with a plurality of flexible partition boundary lines that partition the memory into an upper memory bank and a lower memory bank.

FIG. 1 shows a simplified diagram of a simultaneous operation non-volatile memory device, for example, a simultaneous operation NOR flash memory device which includes a plurality of sectors of memory cells indicated by blocks SA0, SA1, SA2, ... SA63. The memory sectors SA0, SA1, SA2, ... SA63 are arranged in a plurality of rows and columns, with each row containing four memory sectors. The rows of the memory sectors are numbered consecutively from Z4(0) to Z4(15). In addition, the NOR flash memory device further includes memory sectors SS0, SS1, SS2, ... SS6 arranged in rows Z4(16) to Z4(17).

Each sector of the memory cells SA0, SA1, SA2, ... SA63 contains 0.5 megabytes (MB) of memory. Each row of the memory sectors Z4(0), Z4(1), Z4(2), ... Z4(15) includes 2 MB of memory. The last memory sector SA63 is optional and may be regarded as a hidden memory sector. The total memory capacity of the memory sectors SS0 ... SS7 is on the order of about 0.5 MB. The 0.5 MB of memory in the sectors SS0 ... SS7 may be regarded as the minimum lower bank memory required for code storage.

FIG. 1 also shows a plurality of boundary lines, each of which is capable of bisecting the memory into an upper memory bank and a lower memory bank. An example of some possible partitions of a 32 MB flash memory device according to the present invention is illustrated in FIG. 1, with the number before the slash denoting the amount of memory in the upper bank and the number after the slash denoting the amount of memory in the lower bank. The memory partition boundary can be set between any adjacent rows of memory sectors, with each adjacent boundary change resulting in either an increment or a decrement of 2 MB in the upper and lower memory banks if each memory sector contains 0.5 MB of memory and each row contains four memory sectors. FIG. 1 shows only an example of many different possible partitions of memory in a flash memory device with a flexible bank partition architecture. However, the present invention is not limited to the memory partition boundaries as illustrated in FIG. 1; other memory partition boundaries are also feasible.

Figure 2:
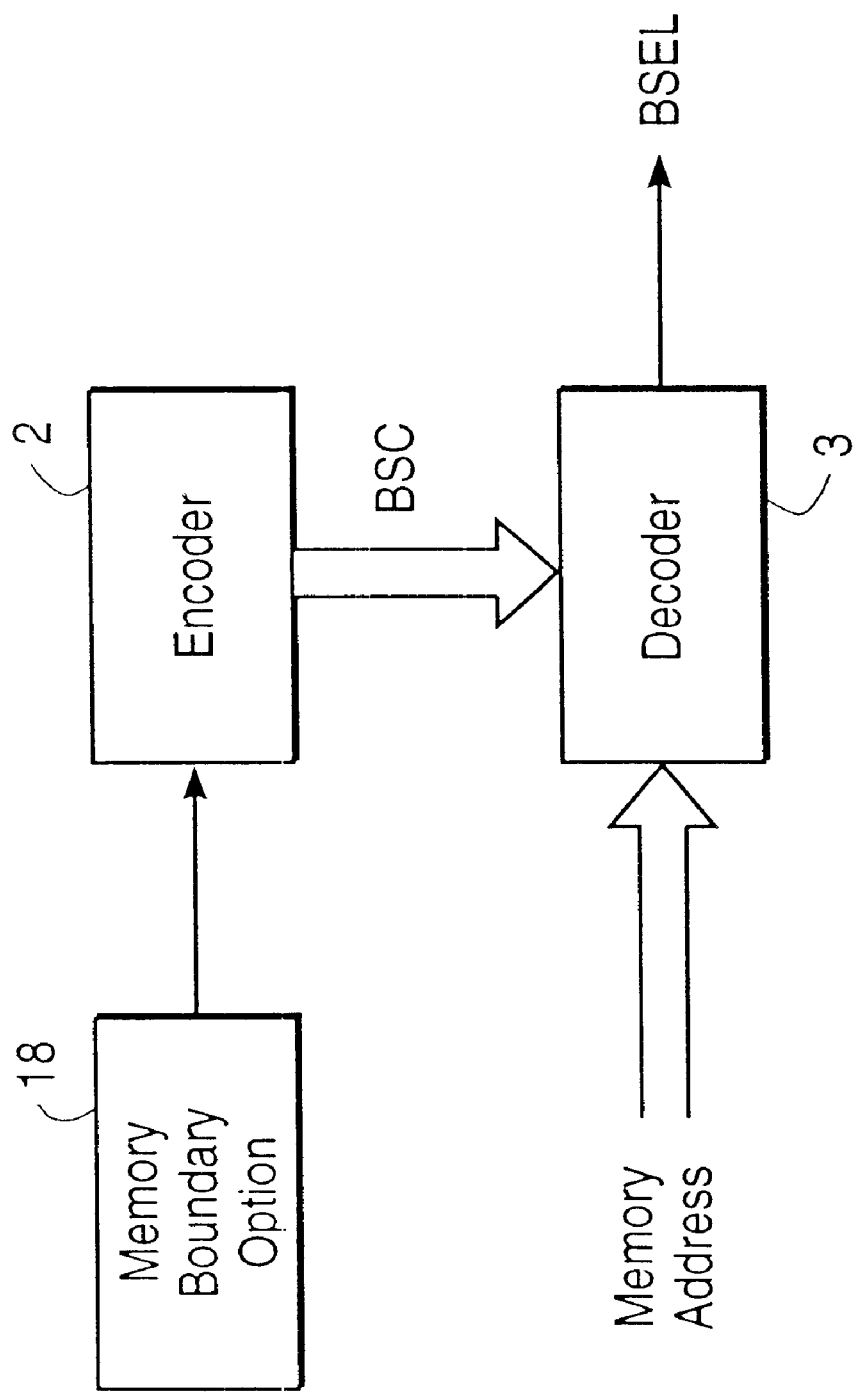
FIG. 2 is a simplified block diagram of the bank selector circuit according to the present invention.

FIG. 2 shows a simplified block diagram of a bank selector circuit for a simultaneous operation flash memory device with a flexible bank partition architecture according to the present invention. The bank selector circuit generally comprises a memory boundary option 18 capable of designating a memory partition boundary selected from a plurality of predetermined memory partition boundaries, a bank selector encoder 2 coupled to the memory boundary option 18, and a decoder 3 coupled to the bank selector encoder 2 and an input memory address. The decoder 3 is capable of outputting a bank selector output signal BSEL based upon the selected memory partition boundary in response to the input memory address. In an embodiment, the memory boundary option 18 has a plurality of partition boundary indicator terminals capable of outputting a partition boundary indicator signal to the bank selector encoder 2 to signify a boundary line between an upper memory bank and a lower memory bank. Since the simultaneous operation flash memory device is capable of being flexibly partitioned into upper and lower memory banks at any one of a plurality of predetermined partition boundaries, the memory boundary option 18 comprises a partition indicator circuit which is capable of indicating a plurality of possible memory partition boundaries. After a particular one of the predetermined memory partition boundaries is selected, a memory partition indicator signal is produced by the memory boundary option 18 to indicate the selected memory partition boundary. The partition indicator circuit in the memory boundary option 18 will be described in further detail below.

The bank selector encoder 2, which is coupled to the partition boundary indicator terminals of the memory boundary option 18 to receive the memory partition boundary indicator signal, is capable of generating a set of code bits of a bank selector code (BSC) in response to receiving the partition boundary indicator signal. In an embodiment, the bank selector code 2 comprises a ROM array which stores a plurality of sets of the bank selector code, each of the bank selector code sets uniquely identifying a respective one of the plurality of predetermined memory partition boundaries. In response to receiving a partition boundary indicator signal from the memory boundary option 18 indicating a particular memory partition boundary, the bank selector encoder 2 outputs a plurality of code bits of the bank selector code which corresponds to the selected memory partition boundary.

The bank selector decoder 3, which is coupled to receive the bank selector code from the bank selector encoder 2, is further coupled to receive a plurality of memory address bits from a plurality of memory address inputs. Based upon the selected memory partition boundary indicated by the bank selector code and the input memory address bits, the bank selector decoder 3 outputs a bank selector output signal BSEL to indicate whether a particular memory address belongs to the lower memory bank or the upper memory bank. Several embodiments of the bank selector decoder 3 according to the present invention are described in further detail below.

Figure 3:
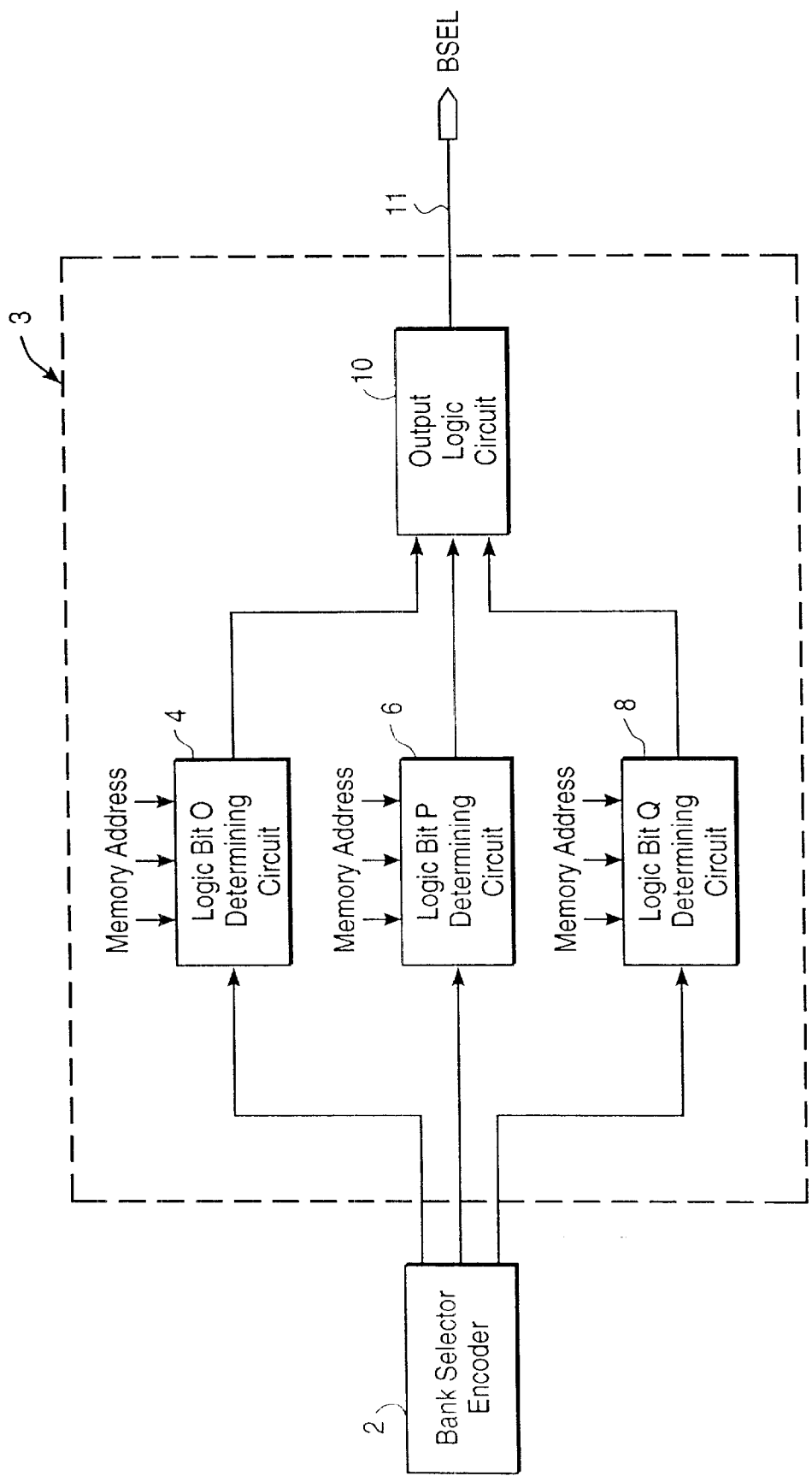
FIG. 3 is a more detailed block diagram of an embodiment the bank selector circuit according to the present invention.

FIG. 3 shows a more detailed block diagram of an embodiment of the bank selector circuit for a simultaneous operation flash non-volatile memory device with a flexible bank partition architecture according to the present invention. The bank selector circuit roughly comprises a bank selector encoder 2, a logic bit O determining circuit 4, a logic bit P determining circuit 6, a logic bit Q determining circuit 8, and an output logic circuit 10. The logic bit O, P and Q determining circuits 4, 6, 8 and the output logic circuit 10 together form the bank selector decoder 3 as shown in FIG. 2. The memory boundary option 18 and the encoder 2 as shown in FIG. 2 are combined in the bank selector encoder 2 as shown in FIG. 3. The bank selector encoder 2 is capable of generating a plurality of code bits of a bank selector code based upon a partition of memory into upper and lower memory banks at a memory partition boundary selected from a plurality of predetermined partition boundaries.

The bank selector circuit according to the present invention also includes a plurality of memory address inputs, and the logic bit O, P and Q determining circuits 4, 6 and 8 are each coupled to receive at least some of the code bits from the bank selector encoder 2 and at least some of the memory address bits from the memory address inputs. The output logic circuit 10 is coupled to receive logic bits O, P and Q from the logic bit O, P and Q determining circuits, respectively, and has a bank selector output 11 which outputs a bank selector signal BSEL to point any particular memory address to either the upper memory bank or the lower memory bank based upon the partition boundary.

Figure 4:
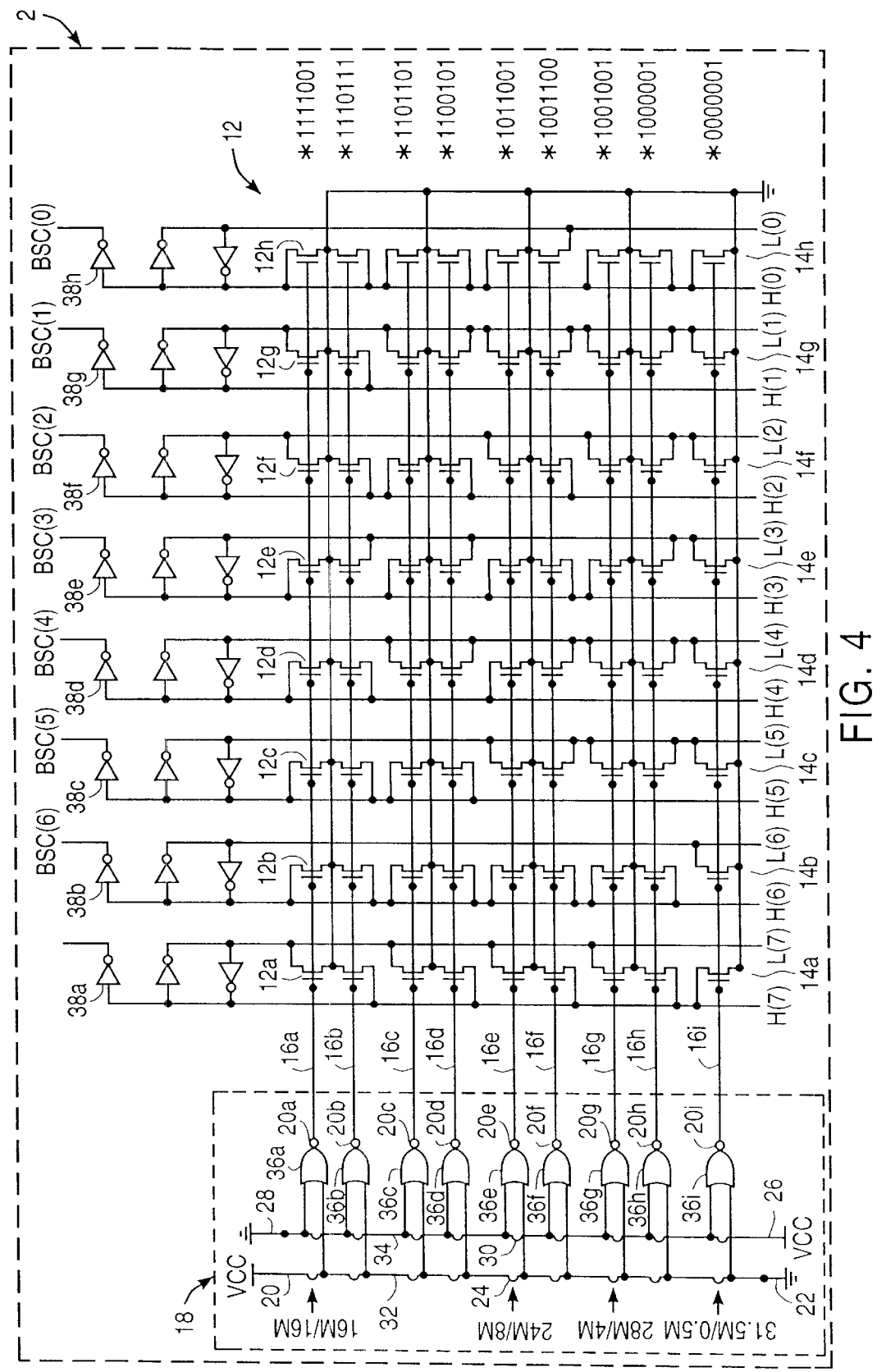
FIG. 4 is a circuit diagram showing an embodiment of a bank selector encoder in the bank selector circuit according to the present invention.

FIG. 4 shows an embodiment of the bank selector encoder 2 which includes a read-only memory (ROM) array 12 comprising a plurality of ROM cells 12a, 12b, 12c, . . . arranged in a plurality of columns 14a, 14b, 14c, . . . and a plurality of rows 16a, 16b, 16c, . . . . In the example illustrated in FIG. 4, the ROM array 12 comprises eight columns and nine rows of ROM cells. In a further embodiment, each of the ROM cells 12a, 12b, 12c, . . . has a channel width-to-length (W/L) ratio of about 2.3/0.7. The ROM array 12 may be physically implemented on a semiconductor integrated circuit in a manner known to a person skilled in the art.

In this embodiment, the bank selector encoder 2 further comprises a partition indicator circuit 18 which is capable of designating a memory partition boundary selected from a plurality of predetermined partition boundaries, to separate the memory into an upper memory bank and a lower memory bank. An embodiment of the memory boundary option 18 in FIG. 2 is illustrated in detail as the partition indicator circuit 18 shown in FIG. 4. The partition indicator circuit 18 shown in FIG. 4 includes a plurality of boundary indicator terminals 20a, 20b, 20c, . . . each coupled to a respective one of the rows 16a, 16b, 16c, . . . of the ROM cells in the ROM array 12.

In a further embodiment, the partition indicator circuit 18 further comprises an upper bank conductive line 32 comprising first and second upper bank conductive line segments 20 and 22 separated by an upper bank conductive line gap, for example, gap 24, which designates the memory partition boundary selected from a plurality of possible partition boundaries, to signify an upper/lower memory bank partition of 24 MB/8 MB. The first upper bank conductive line segment 20 has a first end connected to receive a DC common voltage $V_{cc}$, and the second upper bank conductive line second 22 has a second end which is grounded.

The partition indicator circuit 18 further comprises a lower bank conductive line 34 comprising first and second lower bank conductive line segments 26 and 28 separated by a lower bank conductive line gap, for example, gap 30 as shown in FIG. 4, to designate the memory partition boundary signifying the upper/lower bank partition of 24 MB/8 MB. The first lower bank conductive line segment 26 has a first end which is connected to receive the DC common voltage $V_{cc}$, and the second lower bank conductive line segment 28 has a second end which is grounded. The first upper and lower bank conductive line segments 20 and 26 are positioned opposite each other, and the second upper and lower bank conductive line segments 22 and 28 are positioned opposite each other. The upper and lower bank conductive line gaps 24 and 30, which designate the memory partition boundary of 24 MB/8 MB on the respective upper and lower conductive lines 32 and 34, are positioned corresponding to each other.

The upper bank conductive line 32 can be separated into the first and second upper bank conductive line segments 20 and 22 by the upper bank conductive line gap 24 at one of several positions along the upper bank conductive line 32, each of the positions designating a respective one of the predetermined potential memory partition boundaries. The lower bank conductive line 34 can also be separated into the first and second lower bank conductive line segments 26 and 28 by the lower bank conductive line gap 30 at one of several positions along the lower bank conductive line 34, each of the positions designating a respective one of the predetermined potential memory partition boundaries. For example, as shown in FIG. 1, a 32 MB flash memory can be separated into upper and lower memory banks at any one of the following partitioned boundaries: 16 MB/16 MB, 18 MB/14 MB, 20 MB/12 MB, 22 MB/10 MB, 24 MB/8 MB, 26 MB/6 MB, 8 MB/4 MB, 30 MB/2 MB, and 31.5 MB/0.5 MB.

Referring back to FIG. 4, a plurality of NOR gates 36a, 36b, 36c, . . . each have first and second inputs connected to the upper and lower bank conductive lines 32 and 34, respectively. The outputs of the NOR gates 36a, 36b, 36c, . . . form the respective partition boundary indicator terminals 20a, 20b, 20c, . . . . When the upper and lower bank conductive lines 32 and 34 are broken at designated gaps, the corresponding NOR gate with inputs connected to the respective upper and lower bank conductive lines 32 and 34 at which the gaps are positioned generates a logic bit "1", whereas the other NOR gates each generate a logic bit "0". For example, when the upper and lower bank conductive lines 32 and 34 are broken at the respective gaps 24 and 30 to designate a selected memory partition boundary with an upper bank/lower bank ratio of 24 MB/8 MB, the corresponding NOR gate 36e generates a logic bit "1" while the other NOR gates 36a, 36b, 36c, 36d, 36f, 36g, 36h and 36i each generate a logic bit "0".

In a further embodiment, the bank selector encoder 2 further comprises a plurality of inverters 38a, 38b, 38c, . . . arranged in a plurality of columns, with each column of the inverters 38a, 38b, 38c, . . . coupled to a respective one of the columns 14a, 14b,14c, . . . of the ROM cells in the ROM array 12. The outputs of the bank selector circuit 2, designated as BSC(6), BSC(5), . . . BSC(0), output the respective code bits of a bank selector code based upon the memory partition boundary selected from the predetermined partition boundaries as designated by the corresponding gaps, for example, gaps 24 and 30 along the upper and lower bank conductive lines 32 and 34, respectively.

The columns 14a, 14b, 14c, . . . of the ROM cells in the ROM array 12 have respective inputs H(7), L(7), H(6), . . . L(0) as shown at the bottom of FIG. 4, with the letter H designating a logic bit "1" and the letter L designating a logic bit "0". The code bits of the bank selector code at the outputs BSC(6), BSC(5), . . . BSC(0) are generated according to the selected partition boundary designated by the gaps along the upper and lower bank conductive lines in the partition indicator circuit 18. A unique set of the bank selector code is generated for each of the possible partition boundaries. For example, as shown in FIG. 4, when an upper/lower bank partition of 24 MB/8 MB is desired in a 32 MB flash memory device, the upper and lower bank conductive lines 32 and 34 are broken at the respective gaps 24 and 30, thereby generating a logic bit "1" at the partition boundary indicator terminal 20e for the row 16e of the ROM cells in the ROM array 12, while the other rows 16a . . . 16d and 16f . . . 16i receive logic bit "0" from the respective partition boundary indicator terminals 20a . . . 20d and 20f . . . 20i in the partition indicator circuit 18. In response to receiving logic bit "1" by the row 16e of the ROM cells, the bank selector encoder outputs a bank selector code 1011001 at the outputs BSC(6), BSC(5), . . . BSC(0), respectively.

In an embodiment according to the present invention, the bank selector circuit comprises means 2 for generating a plurality of code bits of a bank selector code at the outputs BSC(6), BSC(5), . . . . BSC(0) based upon a memory partition boundary selected from a plurality of predetermined partition boundaries, and the means 2 for generating the code bits of the bank selector code includes means 18 for designating the partition of boundary into the upper memory bank and the lower memory bank. In a further embodiment, the means 2 for generating the code bits of the bank selector code comprises the bank selector encoder 2 as shown in FIG. 4 and described above. In yet a further embodiment, the means 18 for designating the partition of memory comprises the partition indicator circuit 18 as shown in FIG. 4 and described above.

Figure 5:
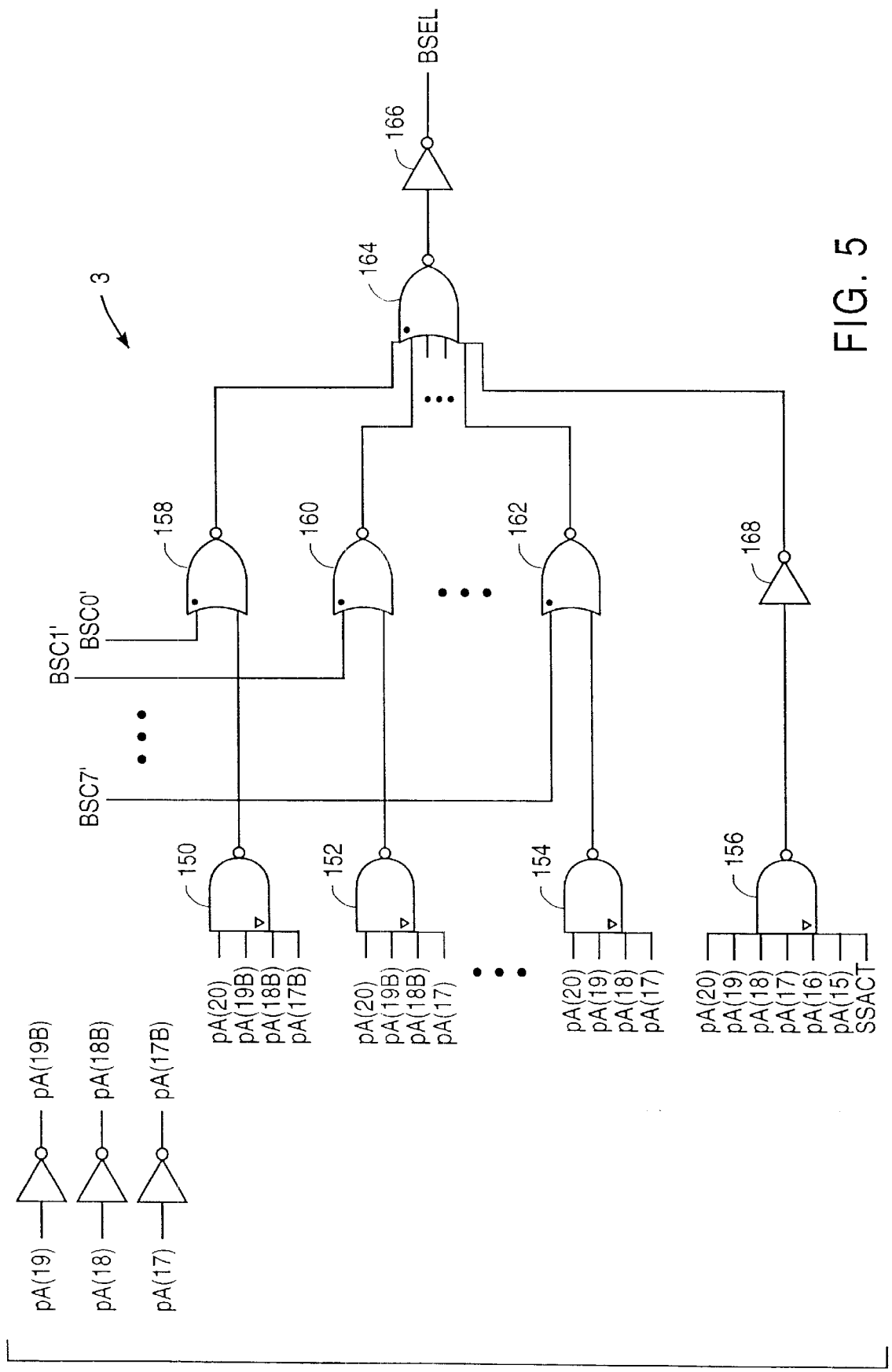
FIG. 5 is a logic circuit showing an embodiment of the bank selector decoder in the bank selector circuit according to the present invention.

In an embodiment as shown in FIG. 5, the bank selector decoder 3 in the bank selector circuit according to the present invention comprises multiple stages of logic gates including a plurality of NAND gates 150, 152, 154 and 156, a plurality of NOR gates 158, 160 and 162, a combining NOR gate 164, and an inverter 166 which generates the bank selector output BSEL. The first-stage NAND gates 150, 152 and 154 are coupled to receive different combinations of non-inverted and inverted bits of the memory address pA(20), pA(19), pA(18), and pA(17). The input bits pA(19B), pA(18B) and pA(17B) are the inverted bits of the memory address input bits pA(19), pA(18) and pA(17), respectively. A plurality of NAND gates (not shown in FIG. 5) in addition to the NAND gates 150, 152 and 154 are included in the first stage of NAND gates to cover all possible combinations of inverted and non-inverted memory address bits pA(20), pA(19), pA(18) and pA(17) as inputs to the NAND gates. The first stage of NAND gates also includes the NAND gate 156 which has a plurality of inputs coupled to receive the memory address bits pA(20), pA(19), pA(18), pA(17), pA(16), pA(15), and a bank selector forcing signal SSACT. The bank selector forcing signal SSACT signifies to the bank selector decoder 3 that the bank selector output BSEL be forced to point to one of the memory banks, for example, the upper memory bank, when the memory address in the hidden sector SA63, which is assigned to the upper memory bank as shown in FIG. 1, is accessed. The bank selector forcing signal SSACT will be described in further detail below.

As shown in FIG. 5, the bank selector decoder 3 further includes a plurality of second-stage NOR gates 158, 160 and 162 each having two inputs, the first inputs of the NOR gates connected to receive the bank selector code bits BSC0', BSC1' and BSC7', respectively. The second inputs of the NOR gates 158, 160 and 162 are connected to the outputs of the NAND gates 150, 152 and 154, respectively. A plurality of additional second-stage NOR gates (not shown in FIG. 5) have inputs connected to the additional first-stage NAND gates (not shown in FIG. 5) and to receive other bank selector code bits BSC2', BSC3', . . . BSC6'. A second-stage inverter 168 is connected to the output of the first-stage NAND gate 156. For the embodiment shown in FIG. 5, the code bits of the bank selector code BSCn', where n is the order of the bank selector code bits from 0 to 7, are listed in Table A below:

TABLE A

| Boundary | BSCn' | | | | | | | |
|---|---|---|---|---|---|---|---|---|
| Upper/Lower | 7 | 6 | 5 | 4 | 3 | 2 | 1 | 0 |
| 16 MB/16 MB | 0 | 0 | 0 | 0 | 0 | 0 | 0 | 0 |
| 18 MB/14 MB | 0 | 0 | 0 | 0 | 0 | 0 | 0 | 1 |
| 20 MB/12 MB | 0 | 0 | 0 | 0 | 0 | 0 | 1 | 1 |
| 22 MB/10 MB | 0 | 0 | 0 | 0 | 0 | 1 | 1 | 1 |
| 24 MB/8 MB | 0 | 0 | 0 | 0 | 1 | 1 | 1 | 1 |
| 26 MB/6 MB | 0 | 0 | 0 | 1 | 1 | 1 | 1 | 1 |
| 28 MB/4 MB | 0 | 0 | 1 | 1 | 1 | 1 | 1 | 1 |
| 30 MB/2 MB | 0 | 1 | 1 | 1 | 1 | 1 | 1 | 1 |
| 31.5 MB/0.5 MB | 1 | 1 | 1 | 1 | 1 | 1 | 1 | 1 |

Furthermore, the bank selector decoder 3 as shown in FIG. 5 comprises a combining NOR gate 164 with inputs connected to the second-stage NOR gates 158, 160 and 162 as well as the second-stage inverter 168. The combining NOR gate 164 has additional inputs connected to the outputs of the additional second-stage NOR gates with inputs coupled to receive bank selector code bits BSC2', BSC3', . . . BSC6' (not shown in FIG. 5). The output of the combining NOR gate 164 is connected to the inverter 166, which outputs the bank selector output signal BSEL.

In an alternate embodiment, the bank selector decoder 3 as shown in the block diagram of FIG. 2 according to the present invention includes logic bit O,P and Q determining circuits 4,6,8 as well as the output logic circuit 10 as shown in FIG. 3. The logic bit P determining circuit 6 is coupled to receive a first plurality of the code bits from the bank selector encoder 2 and a first plurality of memory address bits from the memory address inputs. FIG. 6 shows an embodiment of the logic bit P determining circuit 6 according to the present invention which includes a plurality of p-channel MOS (PMOS) transistors 42, 44, 46, 48, 50 and 52. The PMOS transistor 42 has a source connected to receive the DC common voltage $V_{cc}$ and a gate connected to receive bit pA(19) of the memory address. The PMOS transistor 44 has a source connected to receive the DC common voltage $V_{cc}$ and a gate connected to receive bit pA(18) of the memory address. Similarly, the PMOS transistor 46 has a source connected to receive the DC common voltage $V_{cc}$ and a gate connected to receive bit pA(17) of the memory address.

The PMOS transistor 48 has a source connected to the drain of the PMOS transistor 42, a gate connected to receive the code bit BSC(5) of the bank selector code generated by the bank selector encoder 2 as shown in FIG. 4 and described above, and a drain connected to the logic bit P output 54. As shown in FIG. 6, the PMOS transistor 50 has a source connected to the drain of the PMOS transistor 44, a gate connected to receive the code bit BSC(4) of the bank selector code, and a drain connected to the logic bit P output 54. Similarly, the PMOS transistor 52 has a source connected to the drain of the PMOS transistor 46, a gate connected to receive the code bit BSC(3) of the bank selector code, and a drain connected to the logic bit p output 54.

As shown in FIG. 6, the logic bit P determining circuit 6 further comprises a plurality of n-channel MOS (NMOS) transistors 56, 58, 60, 62, 64 and 66. The NMOS transistors 56, 58 and 60 have respective gates connected to receive the memory address bits pA(17), pA(18), and pA(19), respectively. The drain of the NMOS transistor 60 is connected to the source of the NMOS transistor 58, and the drain of the NMOS transistor 58 is connected to the source of the NMOS transistor 56. The source of the NMOS transistor 60 is grounded while the drain of the NMOS transistor 56 is connected to the logic bit P output 54.

The gates of the NMOS transistors 62, 64 and 66 are connected to receive the code bits BSC(3), BSC(4), and BSC(5), respectively, of the bank selector code generated by the bank selector encoder 2 as shown in FIG. 3 and described above. In FIG. 6, the drain of the NMOS transistor 66 is connected to the source of the NMOS transistor 64, and the drain of the NMOS transistor 64 is connected to the source of the NMOS transistor 62. The source of the NMOS transistor 66 is grounded while the drain of the NMOS transistor 62 is connected to the logic bit P output 54. The drains of the NMOS transistors 60 and 66 are connected together, and the drains of the NMOS transistors 58 and 64 are connected together. The memory address bits pA(17), pA(18), and pA(19) form a first plurality of the memory address bits, and the code bits BSC(3), BSC(4), and BSC(5) form a first plurality of the code bits of the bank selector code.

In an embodiment according to the present invention, the bank selector circuit comprises means 6 for determining the logic bit P, which in a further embodiment comprises the logic bit P determining circuit 6 coupled to receive the first plurality of the memory address bits and the first plurality of code bits of the bank selector code as shown in FIG. 6 and described above. In the example shown in FIG. 6, the PMOS transistors 42, 44, 46, 48, 50 and 52 each have a channel W/L ratio of about 20/0.65, and the NMOS transistors 56, 58, 60, 62, 64, and 66 each have a channel W/L ratio of about 20/0.5.

FIG. 7 shows an embodiment of the logic bit Q determining circuit 8 according to the present invention which includes a plurality of PMOS transistors 68, 70, 72, 74, 76 and 78. The PMOS transistor 68 has a source connected to receive the DC common voltage $V_{cc}$ and a gate connected to receive the memory address bit pA(19). The PMOS transistor 70 has a source connected to the drain of the PMOS transistor 68, a gate connected to receive the memory address bit pA(18), and a drain connected to the logic bit Q output 80. The PMOS transistor 72 has a source connected to receive the DC common voltage $V_{cc}$, a gate connected to receive the code bit BSC(2) of the bank selector code generated by the bank selector encoder 2 as shown in FIG. 3 and described above, and a drain connected to the drain of the PMOS transistor 68.

As shown in FIG. 7, the PMOS transistor 74 has a source connected to the drains of the PMOS transistors 72 and 68, a gate connected to receive the code bit BSC(1) of the bank selector code, and a drain connected to the logic bit Q output 80. The PMOS transistor 76 has a source connected to receive a DC common voltage $V_{cc}$, and a gate connected to receive the memory address bit pA(17). The PMOS transistor 78 has a source connected to the drain of the PMOS transistor 76, a gate connected to receive the code bit BSC(0) of the bank selector code, and a drain connected to the logic bit Q output 80. The memory address bits pA(17), pA(18) and pA(19) are the same as those in the first plurality of the memory address bits for the logic bit P output circuit 6. The code bits BSC(0), BSC(1) and BSC(2) form a second plurality of code bits of the bank selector code.

The logic bit Q determining circuit 8 according to the present invention further includes a plurality of PMOS transistors 82, 84, 86, 88, 90 and 92 as shown in FIG. 7. The NMOS transistor 82 has a gate connected to receive the memory address bit pA(17) and a drain connected to the logic bit Q output 80. The NMOS transistor 84 has a gate connected to receive the code bit BSC(2) of the bank selector code and a drain connected to the source of the NMOS transistor 82. The NMOS transistor 86 has a source which is grounded, a gate connected to receive the memory address bit pA(19), and a drain connected to the source of the NMOS transistor 84.

The NMOS transistor 88 has a gate connected to receive the code bit BSC(0) of the bank selector code, a drain connected to the logic bit Q output 80, and a source connected to the source of the NMOS transistor 82. The NMOS transistor 90 has a gate connected to receive the code bit BSC(1) of the bank selector code and a drain connected to the sources of the NMOS transistors 82 and 88. The NMOS transistor 92 has a source which is grounded, a gate connected to receive the memory address bit pA(18), and a drain connected to the source of the NMOS transistor 90.

In an embodiment according to the present invention, the bank selector circuit includes means 8 for determining the logic bit Q, which in a further embodiment comprises the logic bit Q determining circuit 8 coupled to receive the first plurality of the memory address inputs and the second plurality of the code bits of the bank selector code as shown in FIG. 7 and described above. In the example shown in FIG. 7, the PMOS transistors 68, 70, 72, 74, 76 and 78 each have a channel W/L ratio of 20/0.65, whereas the NMOS transistors 82, 84, 86, 88, 90 and 92 each have a channel W/L ratio of about 20/0.5.

FIG. 8 shows a circuit diagram of an embodiment of the logic bit O determining circuit 4 according to the present invention which includes a plurality of PMOS transistors 94, 96, 98, 100 and 102. The PMOS transistor 94 has a source connected to receive the DC common voltage $V_{cc}$, a gate connected to receive memory address bit pA(20) of the memory address, and a drain connected to the logic bit O output 104. The PMOS transistor 96 has a source connected to receive the DC common voltage $V_{cc}$ and a gate connected to receive memory address bit pA(16) of the memory address. Similarly, the PMOS transistors 98 and 100 have their sources connected to receive the DC common voltage $V_{cc}$. The gates of the PMOS transistors 98 and 100 are connected to receive memory address bit pA(15) of the memory address and a bank selector forcing signal denoted as SSACT, respectively. The drains of the PMOS transistors 96, 98, and 100 are connected together. The source of the PMOS transistor 102 is connected to the drains of the PMOS transistors 96, 98 and 100. The gate of the PMOS transistor 102 is connected to receive code bit BSC(6) of the bank selector code which is generated by the bank selector encoder 2 as shown in FIG. 4 and described above. Referring back to FIG. 8, the drain of the PMOS transistor 102 is connected to the logic bit O output 104.

As shown in FIG. 8, the logic bit 0 determining circuit further includes a plurality of NMOS transistors 106, 108, 110, 112 and 114. The gate of the NMOS transistor 106 is connected to receive the bank selector forcing signal SSACT while the drain of the NMOS transistor 106 is connected to the logic bit O output 104. The gates of the NMOS transistors 108, 110 and 112 are connected to receive the memory address bits pA(15), pA(16) and pA(20), respectively. The drain of the NMOS transistor 108 is connected to the source of the NMOS transistor 106, and the drain of the NMOS transistor 110 is connected to the source of the NMOS transistor 108. The drain of the NMOS transistor 112 is connected to the source of the NMOS transistor 110, while the source of the NMOS transistor 112 is grounded. The NMOS transistor 114 has a gate connected to receive the code bit BSC(6) of the bank selector code and a drain connected to the logic bit O output 104. The source of the NMOS transistor 114 is connected to the drain of the NMOS transistor 112 and the source of the NMOS transistor 110. The memory address bits pA(15), pA(16) and pA(20) form a second plurality of the memory address bits.

The bank selector forcing signal SSACT is used for forcing the bank selector circuit output signal BSEL as shown in FIG. 3 to point to the upper memory bank when the hidden sector SA63, which belongs to the upper bank as shown in FIG. 1, is being accessed, and the memory partition boundary is set at the mode in which the upper bank/lower bank partition ratio is 31.5 MB/0.5 MB. When a logic bit "0" is applied to the gates of the PMOS transistor 100 and the NMOS transistor 106 as the bank selector forcing signal SSACT as shown in FIG. 8, the output BSEL of the output logic circuit 10 as shown in FIG. 3 is logic bit "0". The SSACT signal "0" therefore points the memory address in the hidden sector SA63 to the upper memory bank. In other memory partitioning modes, the bank selector forcing signal SSACT is ignored.

In an embodiment according to the present invention, the bank selector circuit includes means 4 for determining the logic bit O, which in a further embodiment comprises the logic bit O determining circuit 4 coupled to receive the bank selector code and the second plurality of the memory address inputs as shown in FIG. 8 and described above. In a further embodiment, the means 4 for determining the logic bit O includes means 116 for determining whether the memory address belongs to a hidden sector of the memory. As shown in FIG. 8, the means 116 for determining whether the memory address belongs to a hidden sector of the memory includes the PMOS transistor 100 and the NMOS transistor 106 with gates connected to receive the bank selector forcing signal SSACT. In the example shown in FIG. 8, the PMOS transistors 94, 96, 98, 100 and 102 each have a channel W/L ratio of about 20/0.65, while the NMOS transistors 106, 108, 110, 112 and 114 each have a channel W/L ratio of about 20/0.5.

Figure 12:
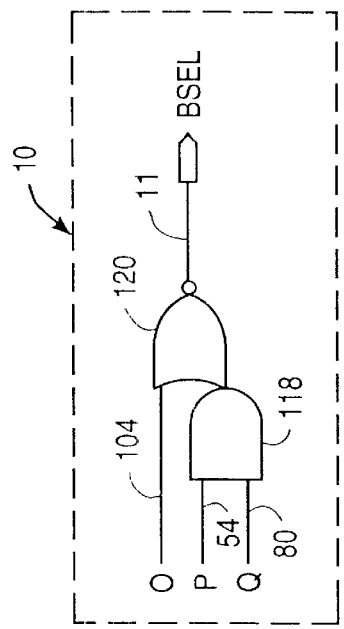
FIG. 12 is a circuit diagram showing an embodiment of an output logic circuit in the bank selector circuit according to the present invention.

FIG. 12 shows an embodiment of the output logic circuit 10 in the bank selector circuit according to the present invention, comprising an AND gate 118 and a NOR gate 120. The AND gate 118 has inputs connected to the logic bit P and Q outputs 54 and 80 of the logic bit P and Q determining circuits 6 and 8 as shown in FIGS. 6 and 7, respectively. Referring back to FIG. 12, the NOR gate 120 has one input connected to the output of the AND gate 118 and another input connected to the logic bit O output 104 of the logic bit O determining circuit 4 as shown in FIG. 8. The output of the NOR gate 120 in the output logic circuit 10 as shown in FIG. 12 forms the single-bit output 11 of the bank selector circuit according to the present invention. The output 11 generates the bank selector output signal BSEL.

The coding of the memory address bits pA(20), pA(19), pA(18), pA(17), pA(16) and pA(15) applicable to the embodiments of the logic bit O, P and Q determining circuits shown in FIGS. 6–8 and described above is listed in Table B below:

TABLE B

| Boundary Upper/Lower | pA(20) | pA(19) | pA(18) | pA(17) | pA(16) | pA(15) |
|---|---|---|---|---|---|---|
| 31.5 MB/ 0.5 MB | 1 | 1 | 1 | 1 | 1 | 1 |
| 30 MB/2 MB | 1 | 1 | 1 | 1 | X | X |
| 28 MB/4 MB | 1 | 1 | 1 | 0 | X | X |
| 26 MB/6 MB | 1 | 1 | 0 | 1 | X | X |
| 24 MB/8 MB | 1 | 1 | 0 | 0 | X | X |
| 22 MB/10 MB | 1 | 0 | 1 | 1 | X | X |
| 20 MB/12 MB | 1 | 0 | 1 | 0 | X | X |
| 18 MB/14 MB | 1 | 0 | 0 | 1 | X | X |
| 16 MB/16 MB | 1 | 0 | 0 | 0 | X | X |

The memory address bits pA(20), pA(19), pA(18) and pA(17) are each assigned either a logic bit "1" or a logic bit "0" for each of the memory partitions. The memory address bits pA(16) and pA(15) are relevant only for the memory partition in the 31.5 MB/0.5 MB mode. In other modes of memory partitions, such as 30 MB/2 MB, 28 MB/4 MB, . . . 16 MB/16 MB, the memory address bits pA(16) and pA(15), with entries denoted as "X", are irrelevant and do not affect the output 11 of the output logic circuit 10.

The code bits of the bank selector code for the memory partitions listed in Table B above as applied to the embodiments shown in FIGS. 4, 6, 7 and 8 and described above are listed in Table C below:

TABLE C

| | | BSC (6:0) | | | | | | |
|---|---|---|---|---|---|---|---|---|
| | Boundary | O | | P | | | Q | |
| Memory Address | Bank Size | 6 | 5 | 4 | 3 | 2 | 1 | 0 |
| pA (20:15) | Upper/Lower | | | | | | | |
| 1000xx | 16 MB/16 MB | 1 | 1 | 1 | 1 | 0 | 0 | 1 |
| 1001xx | 18 MB/14 MB | 1 | 1 | 1 | 0 | 1 | 1 | 1 |
| 1010xx | 20 MB/12 MB | 1 | 1 | 0 | 1 | 1 | 0 | 1 |
| 1011xx | 22 MB/10 MB | 1 | 1 | 0 | 0 | 1 | 0 | 1 |
| 1100xx | 24 MB/8 MB | 1 | 0 | 1 | 1 | 0 | 0 | 1 |
| 1101xx | 26 MB/6 MB | 1 | 0 | 0 | 1 | 1 | 0 | 0 |

TABLE C-continued

| | | BSC (6:0) | | | | | | |
|---|---|---|---|---|---|---|---|---|
| Boundary | | | | | | | | |
| Memory Address | Bank Size | O | P | | | Q | | |
| pA (20:15) | Upper/Lower | 6 | 5 | 4 | 3 | 2 | 1 | 0 |
| 1110xx | 28 MB/4 MB | 1 | 0 | 0 | 1 | 0 | 0 | 1 |
| 1111xx | 30 MB/2 MB | 1 | 0 | 0 | 0 | 0 | 0 | 1 |
| 111111 | 31.5 MB/0.5 MB | 0 | 0 | 0 | 0 | 0 | 0 | 1 |

When the code bits of the bank selector code as listed in Table C above and the memory address bits as listed in Table B above are applied to the circuits as shown in FIGS. 4, 6, 7, 8 and 12 and described above, the output 11 of the output logic circuit 10 generates the bank selector output signal BSEL, which is either a logic bit "1" when the memory address belongs to the lower memory bank or a logic bit "0" when it belongs to the upper memory bank. In this embodiment, the lower memory bank can occupy as much as 16 MB or as little as 0.5 MB of the 32 MB of total memory.

Figure 9:
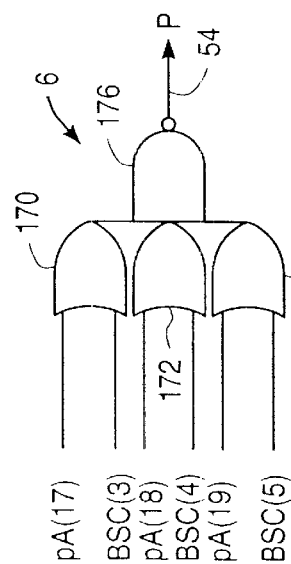
FIG. 9 is a logic circuit showing an alternate embodiment of the logic bit P determining circuit in the bank selector circuit according to the present invention.

FIG. 9 shows a logic circuit of an alternate embodiment of the logic bit P determining circuit 6 according to the present invention. The logic circuit for the logic bit P determining circuit as shown in FIG. 9 is an equivalent of the logic bit P determining circuit of FIG. 6 which comprises a plurality of PMOS and NMOS transistors. Referring to FIG. 9, the logic bit P determining circuit 6 comprises three OR gates 170, 172, 174 and a NAND gate 176. The OR gate 170 has inputs coupled to receive the memory address bit pA(17) and bank selector code bit BSC(3). The OR gate 172 has inputs coupled to receive the memory address bit pA(18) and bank selector code bit BSC(4). The OR gate 174 has inputs coupled to receive the memory address bit pA(19) and bank selector code bit BSC(5). The NAND gate 176 has three inputs connected to the outputs of the OR gates 170, 172 and 174, and has an output 54 which generates the logic bit P.

Figure 10:
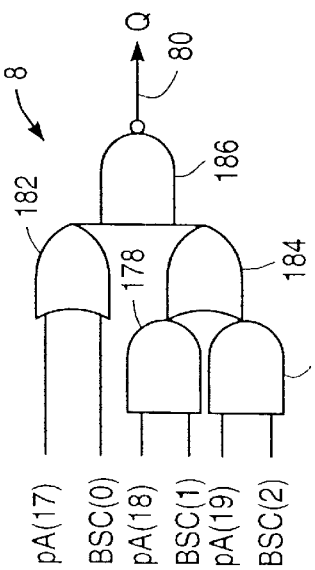
FIG. 10 is a logic circuit showing an alternate embodiment of the logic bit Q determining circuit in the bank selector circuit according to the present invention.

FIG. 10 shows a logic circuit of an alternate embodiment of the logic bit Q determining circuit 8 in the bank selector circuit according to the present invention. The logic circuit for the logic bit Q determining circuit as shown in FIG. 10 is an equivalent of the logic bit Q determining circuit as shown in FIG. 7 which comprises a plurality of PMOS and NMOS transistors. Referring to FIG. 10, the logic bit Q determining circuit 8 comprises two AND gates 178 and 180, two OR gates 182 and 184, and a NAND gate 186. The AND gate 180 has inputs coupled to receive the memory address bit pA(19) and bank selector code bit BSC(2). The AND gate 178 has inputs coupled to receive the memory address bit pA(18) and bank selector code bit BSC(1). The OR gate 182 has inputs coupled to receive the memory address bit pA(17) and bank selector code bit BSC(0). The OR gate 184 has inputs connected to the outputs of the AND gates 178 and 180. The outputs of the OR gates 182 and 184 are connected to the inputs of the NAND gate 186, which has an output 80 generating the logic bit Q in response to the memory address inputs pA(17), pA(18), and pA(19) and the bank selector code inputs BSC(0), BSC(1), and BSC(2).

Figure 11:
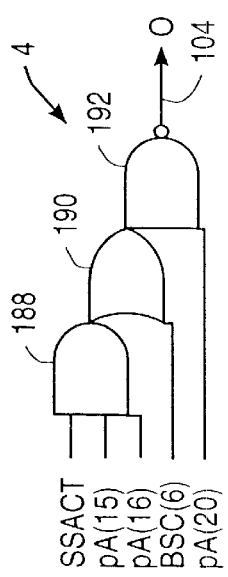
FIG. 11 is a logic circuit showing an alternate embodiment of the logic bit O determining circuit in the bank selector circuit according to the present invention.

FIG. 11 shows a logic circuit of an alternate embodiment of the logic bit O determining circuit 4 in the bank selector circuit according to the present invention. The logic circuit for the logic bit O determining circuit as shown in FIG. 11 is an equivalent of the logic bit O determining circuit as shown in FIG. 8 which comprises a plurality of PMOS and NMOS transistors. Referring to FIG. 11, the logic bit O determining circuit comprises an AND gate 188, an OR gate 190 and a NAND gate 192. The AND gate 188 has three inputs coupled to receive the bank selector forcing signal SSACT and the memory address bits pA(15) and pA(16). The OR gate 190 has an input connected to the output of the AND gate 188 and another input connected to receive the bank selector code bit BSC(6). The NAND gate 192 has an input connected to the output of the OR gate 190, another input connected to receive the memory address bit pA(20), and an output 104 which generates the logic bit O in response to the memory address inputs pA(15), pA(16), pA(20), the bank selector code bit BSC(6) and the bank selector forcing signal SSACT.

The logic bit O, P and Q outputs as shown in FIGS. 9–11 are coupled to the logic bit output circuit 10 as shown in FIG. 12, which is described above. The coding of the memory address bits pA(20), pA(19), pA(18), pA(17), pA(16) and pA(15) as listed in Table B above is applicable to the logic bit O, P and Q determining circuits as shown in FIGS. 9–11. Furthermore, the listing of the bank selector code bits in Table C above is also applicable to the logic bit O, P and Q determining circuits as shown in FIGS. 9–11. The same bank selector output signal BSEL as shown in FIG. 12 would be generated if the logic bit O, P and Q determining circuits as shown in FIGS. 9–11 were replaced by the logic bit O, P and Q determining circuits as shown in FIGS. 6–8, respectively.

INDUSTRIAL APPLICABILITY

The bank selector circuit according to the present invention is applicable for pointing a memory address to either an upper memory bank or a lower memory bank in a simultaneous operation flash memory device with a flexible bank partition architecture. The bank selector circuit according to the present invention generates a bank selector signal which signifies that the memory address belongs to either the upper memory bank or the lower memory bank based upon the memory partition boundary selected from a plurality of predetermined partition boundaries in response to the memory address input. The bank selector circuit according to the present invention may be implemented with the flexible partition flash memory array on the same semiconductor chip. Alternatively, the bank selector circuit according to the present invention may be implemented on a semiconductor chip that is separate from the flash memory array which is accessed by the bank selector circuit.

The invention has been described with respect to particular embodiments thereof, and numerous modifications can be made which are within the scope of the invention as set forth in the claims.

What is claimed is:

1. A bank selector encoder, comprising:
   (a) a partition indicator circuit comprising a plurality of partition boundary indicator terminals for designating a partition of memory into an upper memory bank and a lower memory bank at a memory partition boundary selected from a plurality of predetermined partition boundaries;
   (b) a ROM array comprising a plurality of ROM cells arranged in a plurality of columns and rows, each row of the ROM cells coupled to a respective one of the partition boundary indicator terminals;
   (c) a plurality of serially coupled inverters arranged in a plurality of columns, each column of the inverters coupled to a respective one of the columns of the ROM cells; and (d) a plurality of bank selector code outputs, coupled to the respective columns of the inverters, for outputting a plurality of code bits of a bank selector code.

2. The bank selector encoder of claim 1, wherein the partition indicator circuit comprises means for designating the partition of the memory into the upper memory bank and the lower memory bank.

3. The bank selector encoder of claim 1, wherein the ROM cells each have a channel width-to-length (W/L) ratio of about 2.3/0.7.

4. A bank selector encoder, comprising:
   (a) a partition indicator circuit comprising:
      (i) a plurality of partition boundary indicator terminals for designating a partition of memory into an upper memory bank and a lower memory bank at a memory partition boundary selected from a plurality of predetermined partition boundaries;
      (ii) an upper bank conductive line comprising first and second upper bank conductive line segments separated by an upper bank conductive line gap designating the selected memory partition boundary, the first upper bank conductive line segment having a first end for receiving a DC common voltage, and the second upper bank conductive line segment having a second end for being grounded; and
      (iii) a lower bank conductive line comprising first and second lower bank conductive line segments separated by a lower bank conductive line gap designating the selected memory partition boundary, the first lower bank conductive line segment having a first end for receiving the DC common voltage, the second lower bank conductive line segment having a second end for being grounded, the first ends of the upper and lower bank conductive line segments positioned opposite each other, the second ends of the upper and lower bank conductive line segments positioned opposite each other, and the upper and lower bank conductive line gaps positioned corresponding to each other;
   (b) a ROM array comprising a plurality of ROM cells arranged in a plurality of columns and rows, each row of the ROM cells coupled to a respective one of the partition boundary indicator terminals;
   (c) a plurality of serially coupled inverters arranged in a plurality of columns, each column of the inverters coupled to a respective one of the columns of the ROM cells; and
   (d) a plurality of bank selector code outputs, coupled to the respective columns of the inverters, for outputting a plurality of code bits of a bank selector code.

5. The bank selector encoder of claim 4, wherein the partition indicator circuit further comprises a plurality of NOR gates each having first and second inputs and an output, the first and second inputs of the NOR gates coupled to the upper and lower bank conductive lines, respectively, and the outputs of the NOR gates forming the respective partition boundary indicator terminals.

\* \* \* \* \*